(12) United States Patent
Johnson et al.

(10) Patent No.: US 6,806,650 B2
(45) Date of Patent: Oct. 19, 2004

(54) STRUCTURE AND THE METHOD FOR MEASURING THE SPECTRAL CONTENT OF AN ELECTRIC FIELD AS A FUNCTION OF POSITION INSIDE A PLASMA

(75) Inventors: Wayne L. Johnson, Phoenix, AZ (US); Thomas H. Windhorn, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 290 days.

(21) Appl. No.: 10/218,090

(22) Filed: Aug. 14, 2002

(65) Prior Publication Data
US 2003/0052664 A1 Mar. 20, 2003

Related U.S. Application Data (63) Continuation of application No. PCT/US01/04134, filed on Feb. 9, 2001.
(60) Provisional application No. 60/182,202, filed on Feb. 14, 2000.

(51) Int. Cl.[7] .................................................. H01J 7/24
(52) U.S. Cl. ...................... 315/111.21; 324/96; 324/750
(58) Field of Search ........................ 315/111.21, 111.51, 315/111.81; 324/95, 96, 158.1, 244.1, 750; 350/157, 151; 250/199, 233

(56) References Cited

U.S. PATENT DOCUMENTS

| | | | | |
|---|---|---|---|---|
| 4,070,621 A | * | 1/1978 | Bassen et al. | 324/96 |
| 4,707,147 A | | 11/1987 | Aoki et al. | 374/161 |
| 5,278,499 A | | 1/1994 | Ito et al. | 324/244.1 |
| 5,565,114 A | | 10/1996 | Saito et al. | 216/60 |
| 5,654,796 A | | 8/1997 | Mundt | 356/316 |
| 5,658,423 A | | 8/1997 | Angell | 438/9 |
| 5,781,003 A | * | 7/1998 | Kondo | 324/96 |
| 5,808,415 A | | 9/1998 | Hopkins | 315/111.21 |
| 5,830,310 A | | 11/1998 | Doi | 156/345.25 |
| 5,885,402 A | | 3/1999 | Esquibel | 156/345.24 |
| 6,107,791 A | | 8/2000 | Lee | 324/72.5 |
| 2002/0153874 A1 | * | 10/2002 | Jiang et al. | 324/96 |

FOREIGN PATENT DOCUMENTS

| | | |
|---|---|---|
| EP | 664 460 | 7/1995 |
| EP | 668 506 | 8/1995 |

OTHER PUBLICATIONS

Kuwabara et al., "Development of wide–bank and highly sensitive electric field sensor using LiNbO3 optical modulation," IEEE Proceedings of International Symposium on Electromagnetic Compatability, New York, Aug. 1991, pp. 267–272.

Young, "Electro–Optic E–Field Snesors for Shielding Measurements up to 18 GHz," IEEE Proceedings of International Symposium on Electromagnetic Compatability, New York, Aug. 1995, pp. 87–91.

\* cited by examiner

Primary Examiner—James Vannucci
Assistant Examiner—Jimmy T. Vu
(74) Attorney, Agent, or Firm—Pillsbury Winthrop LLP

(57) ABSTRACT

An RF electric field probe device for measuring an RF electric field intensity in a plasma. The device is composed essentially of an electric field sensing unit and an output unit. The electric field sensing unit is composed of a first electro-optical component positionable in the plasma and operable to modulate light as a function of variations of the RF electric field in the plasma at the fundamental frequency and harmonics of the RF electric field, and a first antenna unit electrically coupled to the first component for coupling the first component to the RF electric field. The output unit is coupled to the electric field sensing unit for providing an output signal containing information relating to the magnitude and frequency of the modulation which occurs in the first component. The probe device may be used to map a plasma region by moving the probe device to any selected point in the plasma region.

21 Claims, 7 Drawing Sheets

STRUCTURE AND THE METHOD FOR MEASURING THE SPECTRAL CONTENT OF AN ELECTRIC FIELD AS A FUNCTION OF POSITION INSIDE A PLASMA

This application is a continuation of international application PCT/US01/04134, filed on Feb. 9, 2001 and claims the benefit of U.S. Provisional Application No. 60/182,202, filed Feb. 14, 2000, the contents of both of which are incorporated herein by reference.

BACKGROUND OF THE INVENTION

The present invention relates to the generation of a plasma inside a chamber which is maintained at a low pressure, and more particularly to measurement of the electric field within the chamber.

A plasma is created and sustained by establishment of an RF electric field in a low pressure plasma region within a chamber which is supplied with a gas that can be ionized by the electric field. The electric field is introduced into the chamber by supplying RF electric energy to a plasma electrode which delimits one end of the plasma region. Such a plasma is employed in the performance of a variety of industrial and scientific processes. For example, plasmas are utilized in the semiconductor fabrication industry for the performance of deposition and etching operations on a semiconductor substrate, or wafer. A wafer to be processed is typically mounted on a wafer chuck which is disposed opposite the plasma electrode and generally delimits another end of the plasma region.

It is usually desirable to establish conditions which are as uniform as possible across the surface of the wafer so that the resulting etching or deposition procedure will have an effect which is as uniform as possible across the wafer surface. Achievement of this goal is influenced to a substantial extent by the degree of uniformity of the RF electric field within the plasma region. Therefore, a detailed knowledge of the electric field pattern within a plasma region would be of considerable value in understanding the processes being performed in the plasma, and would be of considerable assistance in the design and adjustment of plasma generating systems.

Any effort to obtain such knowledge must take into account the fact that the RF electric field in a plasma region includes substantial energy components at a number of frequencies that are harmonics of the fundamental frequency and the trend in this field is toward ever higher RF frequencies and ever higher plasma densities. The harmonic content of the RF field in the plasma increases with increasing RF fundamental frequency and increasing plasma density. As the frequency and/or the plasma density increases, so does the tendency of the electric field to become nonuniform across the surface of the plasma electrode and within the plasma region.

It has already been proposed in the prior art to map the characteristics of a volume of plasma in a plasma region by directing light emissions from different points in the plasma region to a photo sensitive detector. It has also been proposed in the prior art to monitor a plasma process with the aid of a diagnostic head assembly that can include a quartz crystal microbalance, an optical endpoint detector and a Langmuir probe.

It has further been proposed to project linearly polarized light through a plasma and to detect the light after it has passed through the plasma as a means for measuring the electron density, conductivity and/or temperature of the plasma. It is also known in the prior art to collect spectral data characterizing an emission of light from an etch species contained in a plasma during an etch process for the purpose, inter alia, of identifying the presence of foreign material faults within the plasma region.

Systems for sensing the RF current level delivered to a plasma have also been proposed, as have methods for detecting the endpoint of a plasma process by detecting emission spectra in a specific wavelength band of an active species in the plasma. According to other prior art teachings, the endpoint of a post treatment is detected by detecting discharge characteristic values at an RF electrode.

Also in the prior art, inductance probes has been employed for various purposes, such as measuring the stability and magnetic confinement of a plasma. Known probes of this type have a capability of detecting frequencies up to several hundred MHz. Simple probes for measuring the potential of a plasma at low frequencies are also known in the art.

A complete understanding of the electric field configuration in a plasma would be greatly aided by the ability to detect electric field components at frequencies of greater than 100 MHz. Currently, there are no devices available which can be safely introduced into the high temperature environment of a plasma region and can provide an indication of the intensity, or voltage gradient, of components of the electric field in such a plasma at both the fundamental frequency and significant harmonic frequencies.

BRIEF SUMMARY OF THE INVENTION

The present invention is an RF electric field probe device for measuring an RF electric field intensity in a plasma. The device is composed essentially of an electric field sensing unit and an output unit. The electric field sensing unit is composed of a first electro-optical component positionable in the plasma and operable to modulate light as a function of variations of the RF electric field in the plasma at the fundamental frequency and harmonics of the RF electric field, and a first antenna unit electrically coupled to the first component for coupling the first component to the RF electric field. The output unit is coupled to the electric field sensing unit for providing an output signal containing information relating to the magnitude and frequency of the modulation which occurs in the first component.

The invention also relates to methods for mapping a plasma region with an RF electric field sensing unit having a frequency response which encompasses fundamental and significant harmonic frequencies of the RF electric field and apparatus for moving the probe device to any selected point in the plasma region.

BRIEF DESCRIPTION OF THE SEVERAL VIEWS OF THE DRAWING

In FIGS. 8, 9 and 10, exemplary dimensions, in centimeters, of various components of the probe device are indicated.

DETAILED DESCRIPTION OF THE INVENTION

Figure 1:
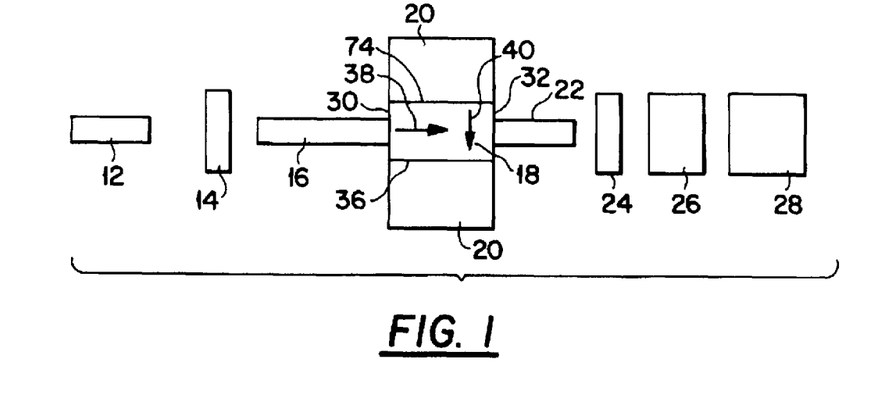
FIG. 1 is a simplified pictorial diagram illustrating the components of a first embodiment of an RF field probe device equipped with a first embodiment of an electric field sensing unit according to the present invention.

The system illustrated in FIG. 1 is composed of a laser beam source 12 which emits a collimated beam of monochromatic light. This beam is directed through a polarizer 14 which linearly polarizes the beam in a selected direction normal to the beam axis. The polarized light is directed into a first optical fiber 16 which is coupled to introduce the polarized beam into a body 18 made of a crystal material having the electro-optical property that it rotates the angle of polarization of a light beam passing therethrough in response to an electric field perpendicular to the path of a light beam through body 18.

Body 18 is sandwiched between two metal blocks, or plates, which constitute field antennas 20. Body 18 and antennas 20 constitute essentially the electric field sensing unit of this embodiment.

A second optical fiber 22 is coupled to body 18 and is arranged to direct the polarized beam from body 18 successively through an analyzer 24, a light intensity detector 26 and a spectral analyzer 28.

The output end of optical fiber 16 contacts an input end surface 30 of body 18 and may be connected by bonding to input surface 30 of body 18 by any suitable adhesive, or by a layer of a low melting point glass. Similarly, the input end of optical fiber 22 contacts an output end surface 32 of body 18 and may be bonded to in a similar manner. End surfaces 30 and 32 face one another at opposite ends of body 18.

Each antenna 20 is preferably bonded to a respective lateral surface 34, 36 of body 18, essentially in the same manner that fibers 16 and 22 are bonded to surfaces 30 and 32. Lateral surfaces 34 and 36 face one another at opposite lateral sides of body 18 and are transverse, and preferably perpendicular, to surfaces 30 and 32.

In operation, if a polarized light beam passes through crystal 18 between surfaces 30 and 32, for example in a beam travel direction 38, and an electric field extends through crystal 18 in an electric field direction 40, transverse, and preferably perpendicular, direction 38, the polarization direction of the beam will be rotated about an axis extending in beam travel direction 38 by an amount proportional to the instantaneous intensity, or voltage gradient, of the electric field in electric field direction 40.

The light beam may, for example, initially be polarized in the direction parallel to the plane of FIG. 1. The light must be polarized in a direction at 45 degrees to the crystal axis. The crystal axis must be at 45 degrees to the applied electric field for maximum rotation of the light beam.

The light beam whose polarization direction has been rotated in body 18 then travels through optical fiber 22 and analyzer 24. Analyzer 24 passes a portion of the polarized beam which is proportional to the component of the polarized beam in the original direction of polarization, i.e. proportional to the cosine of the angle through which the polarization plane rotates while traveling through body 18, provided that the angle of rotation is not greater than $\pi/2$ Radians.

The intensity of the light beam passing through analyzer 24 is then detected by detector 26, which produces an electrical signal proportional to the light beam intensity and delivers that signal to spectral analyzer 28. In spectral analyzer 28, an indication of the intensity of the electric field at the fundamental electric field frequency and each harmonic of the fundamental electric field frequency is determined and displayed, mapped, stored and/or printed out.

Antennas 20 are provided primarily to apply a given electric field intensity value uniformly along the length of body 18, i.e. along direction 38 and to provide an electric field intensity value, between surfaces 34 and 36, which is equal to the voltage differential existing between the outermost surfaces of antennas 20, i.e. between the upper horizontal surface of the upper antenna 20 and the lower horizontal surface of the lower antenna 20, as viewed in FIG. 1. As a result, the intensity of the electric field acting on a polarized beam in body 18 can be made significantly greater than the intensity of the electric field, or the voltage differential, that would exist between surfaces 34 and 36 if no antennas were present. Thus, by increasing the height of antennas 20, the voltage differential between surfaces 34 and 36 can be increased, resulting in an increase in the rotation of the angle of polarization of the light beam about direction 38. On the other hand, as the height of antennas 20 is increased, the spatial resolution that can be achieved by the device is diminished because the voltage differential that acts on the polarized light beam will, in fact, be proportional to the voltage differential, or average electric field intensity, between the outer horizontal surfaces of antennas 20.

Correspondingly, as the length of body 18 and antennas 20 in direction 38 is increased, the rotation experienced by the polarization direction of the light beam in response to a given electric field intensity will increase, while the spatial resolution provided by the device will decrease.

The dimension of antennas 20 in the direction perpendicular to the plane of FIG. 1 will determine the spatial resolution of the electric field measurement produced by the device in the direction perpendicular to the plane of FIG. 1.

In all embodiments of the invention disclosed herein, components 12, 14, 16, 22, 24, 26 and 28 can all be constructed according to principles known in the art and can, in particular, be constituted by commercially available devices and optical fibers.

Body 18 can be made of any material known to have the electro-optical property described above and cut to have any suitable dimension which allows the desired degree of polarization direction rotation and spatial resolution to be achieved for a given electric field intensity. Preferably, use is made of one of the known crystal materials having a linear electro-optical property. One preferred material is a potassium dihydrogen phosphate (KDP) crystal. Other exemplary materials which display a satisfactory electro-optical property and which can be used in embodiments of the invention are ADP, KD*P and CD*A crystals. One significant characteristic of devices according to the present invention is their ability to measure and indicate electric field variations at very high frequencies, and in particular electric field variations in the frequency range of 10 MHz to 1 GHz. This will allow measurement of substantially all significant harmonic components of RF fields at the frequencies employed in existing plasma sources, and at the frequencies which are expected to be employed in future plasma sources.

In addition, crystals of the type described above also have a frequency response capable of providing the desired indications of electric field intensities at frequencies in the above-mentioned range. In addition, an arrangement of crystal 18 and the antennas 20 will be capable of providing accurate measurements of RF field voltage gradients of the order of 500–10,000 volts/meter in a plasma. Adjustment of the electrode to crystal dimension can adjust the range of measurement to within, above, or below this range.

When any device is introduced into a plasma, and particularly a high density plasma, it is subject to intense heating. Therefore, such a device must be made of components which can withstand intense heating or must include a cooling system to maintain those components at a suitable operating temperature. Devices according to the invention have, as one advantage, that only optical fibers 16 and 22, crystal body 18 and antennas 20 must be physically present in the plasma. The primary function of optical fibers 16 and 22 is to couple crystal body 18 to components 12, 14, 24, 26 and 28. Therefore, the latter components can be disposed outside of the plasma region and will therefore not be subject to intense heating or corrosive plasma conditions. The crystals can only be accurate in producing a calibrated measurement of the electric field when temperature controlled.

Although metal plates 20 can withstand intense heating, the preferred materials for body 18 are susceptible to damage and variation in their operating characteristics when heated to high temperatures. Therefore, in preferred embodiments of the invention, at least crystal body 18, and preferably also optical fibers 16 and 18, are installed in an enclosure through which a cooling fluid will circulate, as will be described below with reference to FIGS. 3–5

Figure 2:
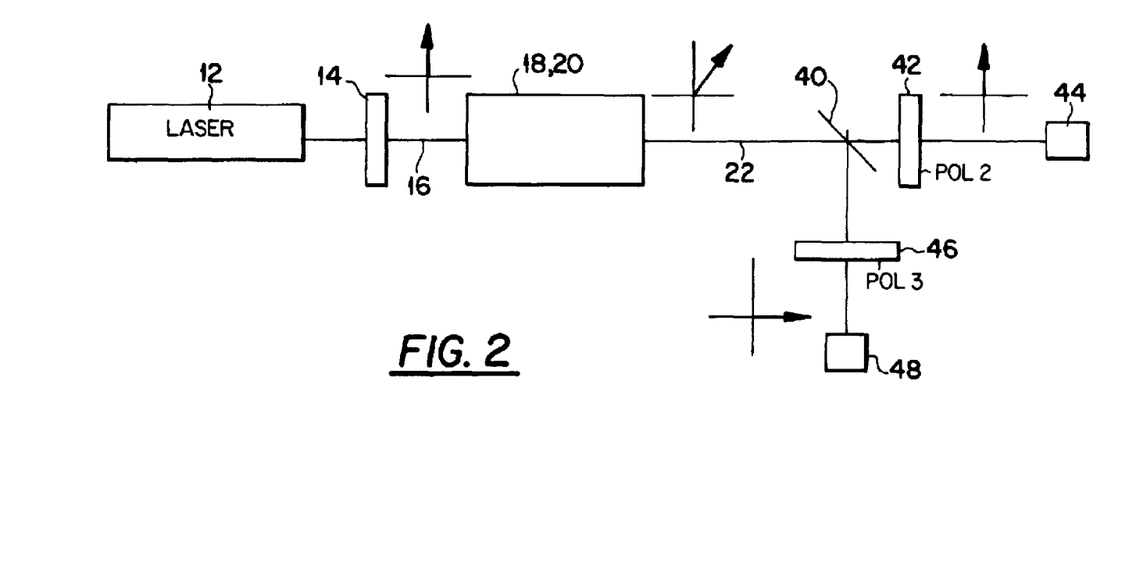
FIG. 2 is a simplified pictorial diagram illustrating the components of a second embodiment of an RF field probe device according to the present invention.

A second embodiment of a device according to the invention is shown in FIG. 2 which differs from the embodiment of FIG. 1 by the provision of a partially reflecting mirror 40 which divides light from optical fiber 22 into two paths, one containing a vertically polarizing filter 42 and an intensity detector 44, and the other of which contains a horizontally polarizing filter 46 and a second detector 48. Polarizers 42 and 46 are set to detect the complementary polarization. With signal comparisons we can determine the ratio of the vertically to horizontally polarized light. These polarizers are the same as analyzer 24 in structure and function.

The electrical signal to each of detectors 44 and 48 will be proportional to the sine and cosine, respectively, of the angular rotation experienced by the linearly polarized light beam in a crystal body or bodies. The ratio of the intensities of the signals delivered to detectors 44 and 48 will allow direct determination of the degree of polarization direction rotation induced by the RF field voltage upon the crystal body or bodies. This will allow the RF field intensity, or voltage gradient, at the sensing unit to be directly determined. The outputs of the two detectors are fed into a ratio circuit, the output of which is fed to the spectrum analyzer.

The use of two detectors in the manner described with respect to FIG. 2 permits a more accurate measurement to be obtained in that the ratios of the outputs from the two detectors 44 and 48 will provide a direct indication of the magnitude of polarization direction rotation even if the intensity of the light beam should undergo unintended variations.

Figure 3:
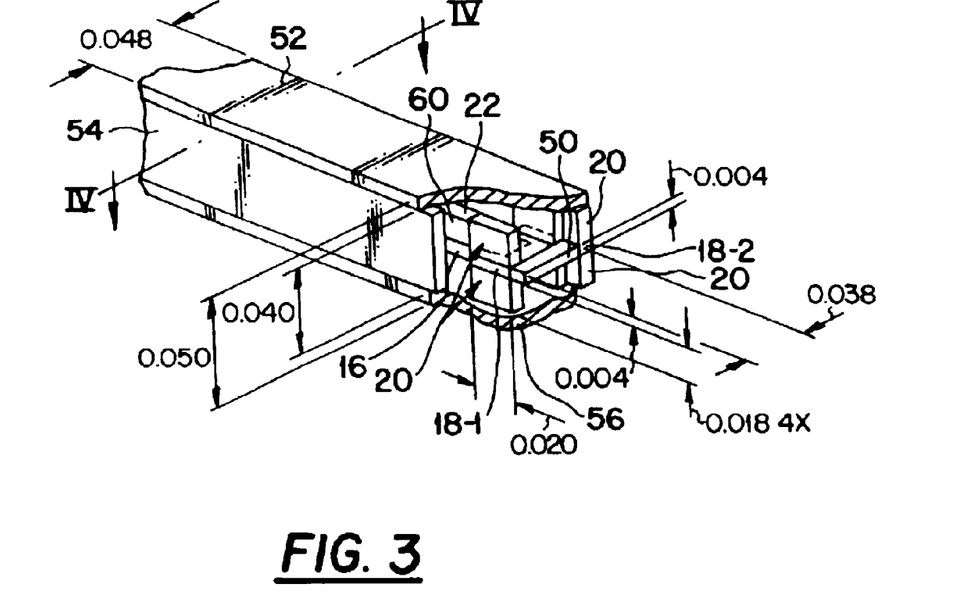
FIG. 3 is a partly cut-away perspective view of components of a second embodiment of an electric field sensing unit according to the present invention.
Figure 4:
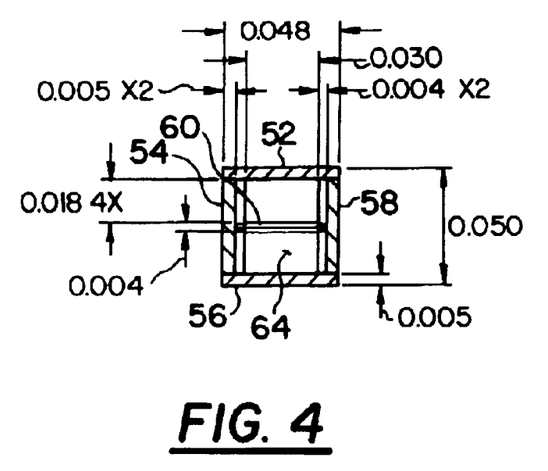
FIG. 4 is a cross-sectional view along plane IV–IV of FIG. 3.
Figure 5:
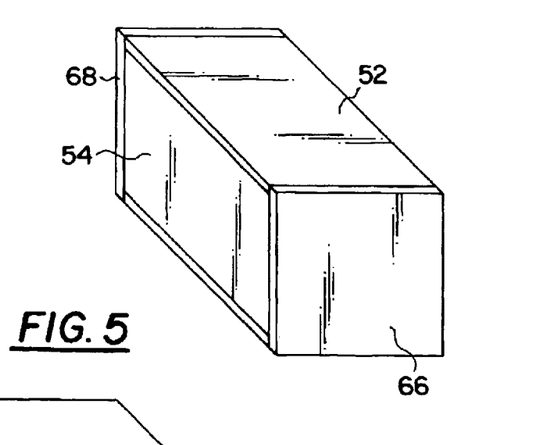
FIG. 5 is a perspective view of the exterior of the unit shown in FIGS. 3 and 4.

A second embodiment of an electric field sensing unit according to the invention is illustrated in FIGS. 3–5. This unit is constructed to operate essentially according to the same principle as the sensing unit shown in FIG. 1 and can be employed in either of the probe devices shown in FIGS. 1 and 2 in place of components 18 and 20. One feature of the embodiment of FIGS. 3–5 is that it is equipped with a cooling system.

This embodiment is composed of two crystals 18-1 and 18-2, each sandwiched between two antennas 20. Optical fiber 16 is secured to the input surface of crystal body 18-1 and optical fiber 22 is secured to the output surface of crystal body 18-2. The output surface of crystal body 18-1 is optically coupled to the input surface of body 18-2 by an optical coupling unit which may be composed of two reflecting prisms 50 and, optionally, a light guide between prisms 50.

All of the components described above are installed in a sealed housing having a generally rectangular cross section and composed of a plurality of flat plates 52, 54, 56 and 58, as shown in FIGS. 3–5. Plates 52–58 are made of a material which is as transparent as possible to electric fields, exemplary materials being alumina or quartz. The device further includes a horizontal septum 60 which divides the interior of the housing into two portions forming, as represented particularly in FIG. 4, a flow channel 64 having two branches. Septum 60 can also be given a vertical orientation. A cooling fluid can be directed through one of these branches, past crystals 18-1 and 18-2 and around the free end of septum 60, and then back through the other one branch. When following this path, the cooling fluid will flow adjacent crystal bodies 18–21, as well as antennas 20. By proper selection of the spacing between bodies 18-1 and 18-2 and of the flow rate of cooling fluid, bodies 18-1 and 18-2, as well as the antennas 20, can be maintained at a suitable operating temperature.

As shown in FIG. 5, the housing is completed by a front end plate 66 and a rear end plate 68, both made of the same material as plates 52–58. Rear end plate 68 can be provided with two openings (not visible) for delivery of cooling fluid to and withdrawal of cooling fluid from channels 64. Plates 52–58, 66 and 68 are bonded together to hermetically seal the interior of the housing. Alternatively, the housing may be extended longitudinally away from front end plate 66 to a sufficient length to extend out of a plasma chamber in which measurements are to be performed.

The essential differences between the embodiment shown in FIGS. 3–5 and that of FIG. 1 are that in the embodiment of FIGS. 3–5, the optical path length through crystal material can effectively be doubled without reducing the spatial resolution in the direction of the light paths through bodies 18-1 and 18-2, and space is provided between those bodies for flow of cooling medium.

One significant advantage of the embodiments shown in FIGS. 1–5 is that the are no electrical connections to the electric field sensing unit. This simplifies the structure of the device and avoids the creation, at the sensing unit, of any extraneous electric fields that might interfere with the RF electric field to be measured. Any connection to ground even through a capacitance generates a voltage that will increase ion bombardment of the probe, modify the plasma potential and perhaps cause either failure of the probe or modify the measurement.

The embodiments illustrated in FIGS. 1–5, described in detail above, are capable of responding to variations in the intensity of an electric field in the direction between surfaces 34 and 36 of body 18 of FIG. 1 and between corresponding surfaces of bodies 18-1 and 18-2 of FIGS. 3–5. Each device can be inserted into a plasma region for measurement of electric field intensity variations in any desired direction. However, these devices are capable of measuring intensity variations in only one direction at any given moment.

However, if the intensity variations in two or three mutually orthogonal directions could be measured simultaneously, a more complete understanding of the electric field pattern in a plasma could be obtained.

This can be achieved by a means of a probe device according to a further embodiment of the invention which combines three versions of the electric field sensing unit shown in FIGS. 3–5 in a compact structure.

Figure 6:
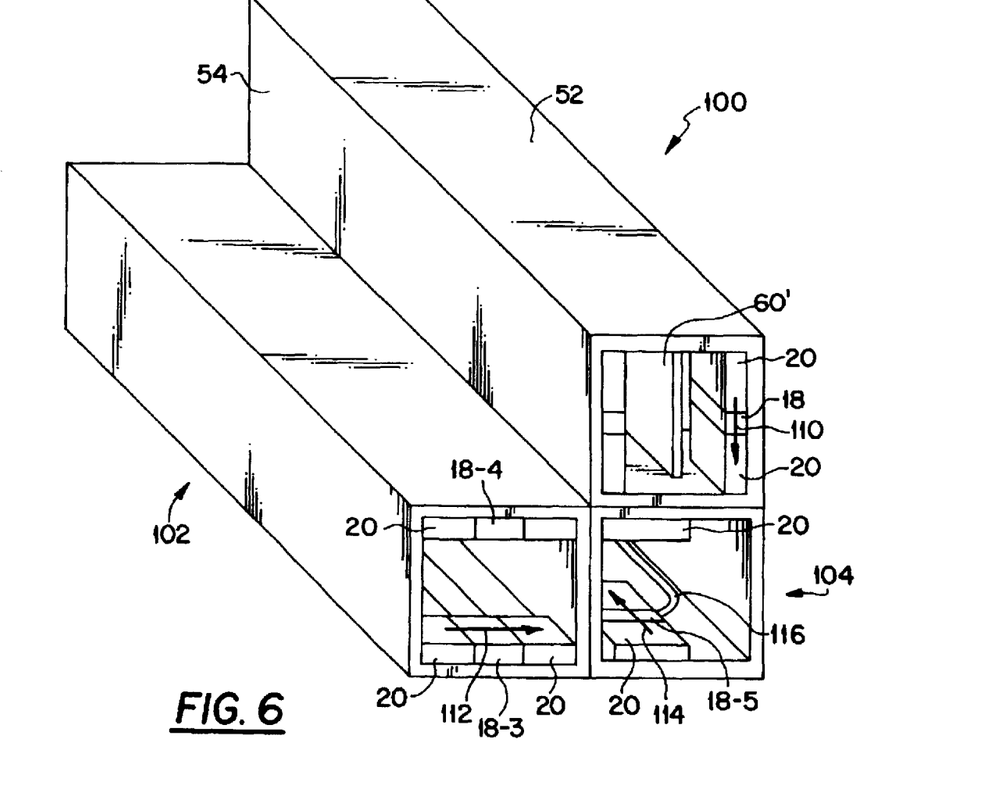
FIG. 6 is a partly cut-away perspective view of components of a third embodiment of an RF field probe device according to the present invention.

One exemplary embodiment of such a probe device is shown in FIG. 6. This embodiment is composed essentially of three field sensing units 100, 102 and 104. Each of field sensing units 100 and 102 can be identical to the field sensing unit shown in FIGS. 3–5, and the third field sensing unit 104 differs from units 100 and 102 only with respect to the orientation of the crystal bodies and antennas. Unit 100 is shown with a vertically oriented septum 60', to illustrate that this septum can have either one of two orientations.

In unit 102, crystal bodies 18-3 and 18-4 are spaced vertically from one another and sandwiched between two antennas which are spaced apart in the vertical direction. In unit 104, the crystal bodies, one of which is shown as body 18-5, are also spaced apart vertically and are each sandwiched between two antennas 20 that are spaced apart in the horizontal direction. However, the direction in which antennas 20 are spaced from crystal body 18-5, as well as from the associated, not visible, crystal body in unit 104 is perpendicular to the direction associated with unit 102.

In FIG. 6, to simplify the illustration, the light reflecting arrangements between the crystal bodies of each unit and the end plate which covers and seals the front end of each unit are not illustrated.

In the illustrated arrangement, unit 100 will provide an output signal representing variations in electric field intensity, or voltage gradient, in a vertical direction 110, unit 102 will provide an output signal representing similar variations in a first horizontal direction 112 and unit 104 will provide an output signal representing similar variations in a second horizontal direction 114 that is perpendicular to direction 112. Thus, the output signals from the three units 100, 102 and 104 will represent three mutually orthogonal components of the electric field intensity at the location of the sensing units. As shown, in unit 104, the optical fibers, one of which is shown at 116, will be bent in order to be coupled to the crystal bodies and to then extend along the length of the associated housing.

Embodiments of the invention can also be constructed with two mutually perpendicular sensing units. In the case of the embodiment illustrated in FIG. 6, or an embodiment having only two mutually perpendicular sensing units, each sensing unit will be associated with two optical fibers and input and output components arranged as shown in FIG. 1 or FIG. 2. It should also be understood that a device according to the invention for measuring an electric field in two or three different directions could also employ a plurality of the sensing units shown in FIG. 1.

A probe device according to the embodiments of the invention described above is placed into operation by introducing the sensing unit into a plasma chamber. In the embodiments of FIGS. 2–6, a dielectric cooling fluid, such as Fluorinert is caused to flow through cooling channel 64 in order to maintain the crystal bodies at a stable temperature within operating temperature limits thereof. A polarized light beam is produced by components 12 and 14 and conducted via fiber 16 to crystal body 18 or 18-1. Then, a plasma is established in the chamber by introduction of a suitable ionizable gas and establishment of an appropriate RF electric field, resulting in the creation of an RF voltage gradient, or differential, between the outer surfaces of antennas 40. The resulting RF voltage differential between the outer surfaces of antennas 40 then appears across the crystal body or bodies. The direction of polarization of the polarized beam is rotated by the electric field voltage differential applied across the crystal body or bodies by in response to the fundamental and all significant harmonic frequency components of the RF field voltage. The resulting altered beam is conducted via fiber 22 to the associated opto-electric converters, detectors and spectral analyzer. The resulting electric signal supplied to analyzer 28 will be subjected to spectral analysis and the results thereof will be displayed, stored and/or recorded.

Figure 7:
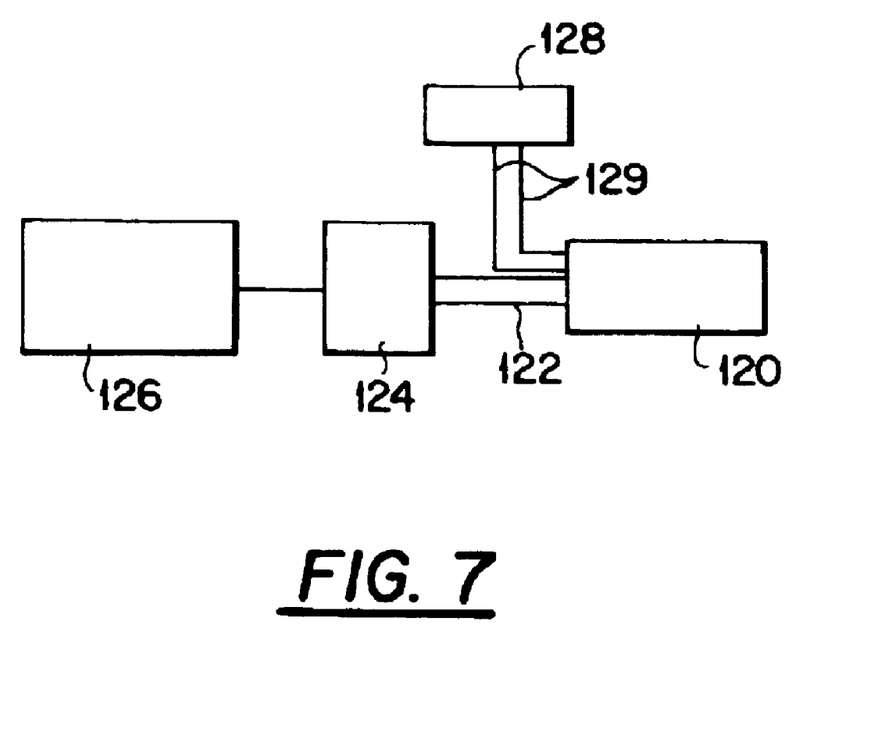
FIG. 7 is a block diagram illustrating the basic components of a fourth embodiment of an RF field probe device according to the invention.

FIG. 7 is a block diagram showing the basic components of a fourth embodiment of a probe device according to the invention. This embodiment includes an electric field sensing unit 120, an optical fiber 122 for conducting light modulated by an electric field, an opto-electrical converter 124 which is coupled to fiber 122 and generates an output signal representative of the light conducted by fiber 122, and a spectral analyzer 126 connected to receive the output signal from converter 124. Converter 124 and analyzer 126 can be constituted by components which are well known in the art and are commercially available. The probe device also includes source 128 which is connected to sensing unit 120 via a pair of conductors 129 to provide a DC bias voltage needed for operation of this embodiment.

Figure 8:
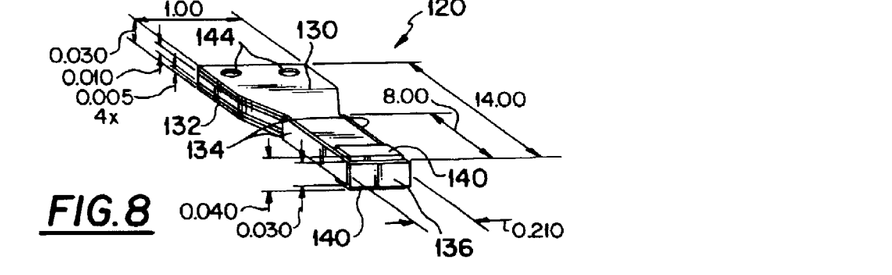
FIG. 8 is a perspective overview of one form of construction of an embodiment of a sensing unit according to the invention which is constructed for use in the probe device shown in FIG. 7.

FIG. 8 shows, essentially, a housing of one suitable embodiment of sensing unit 120. This housing is composed of upper and lower plates 130 and 132, side plates 134 and a front plate 136. Optical fiber 122 out of the housing via one of two openings 144 provided for passage of a cooling fluid. A feed through outside the vacuum system passes fiber 122 outside the system. In addition, the housing can be provided with additional vertically extending side plates behind plates 134, or are plates 130 and 132 can be simply bonded to the horizontal circuit board plates. A further plate (not visible) is provided at the back surface of the housing to seal the housing against cooling fluid leakage.

Each of plates 130, 132, 134 and 136 may be made of any suitable dielectric material, such as alumina or quartz. Two antenna plates 140 are each mounted on the exterior surface of a respective one of housing plates 130 and 132. Housing plate 130 is provided with two openings 144 for passage of a cooling fluid, as will be described in greater detail below.

Figure 9:
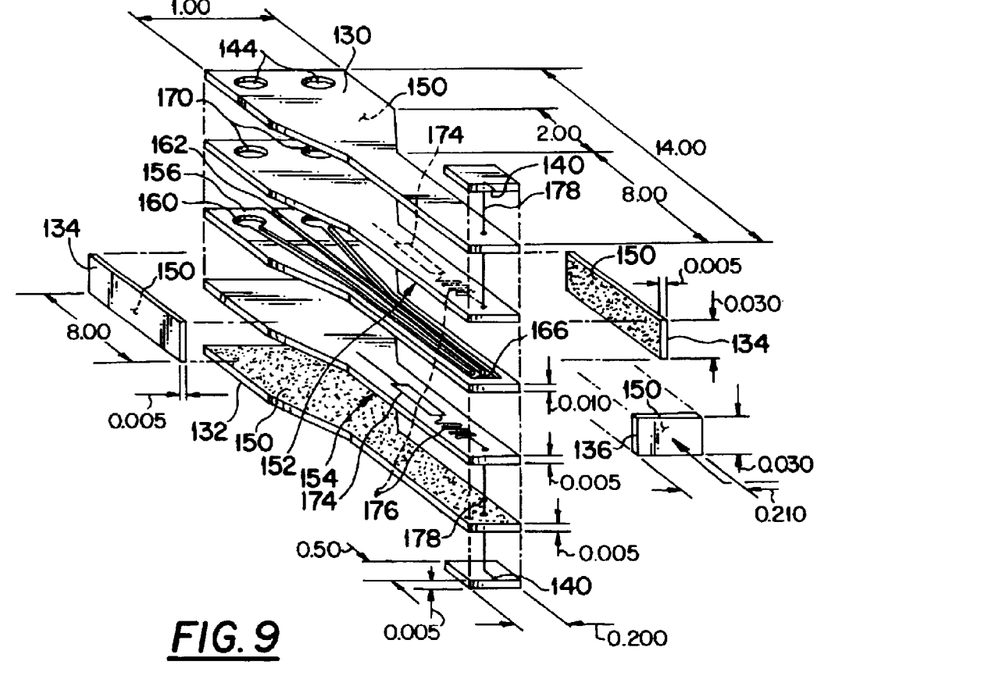
FIG. 9 is an exploded perspective view showing components of the probe device of FIG. 8.
Figure 10:
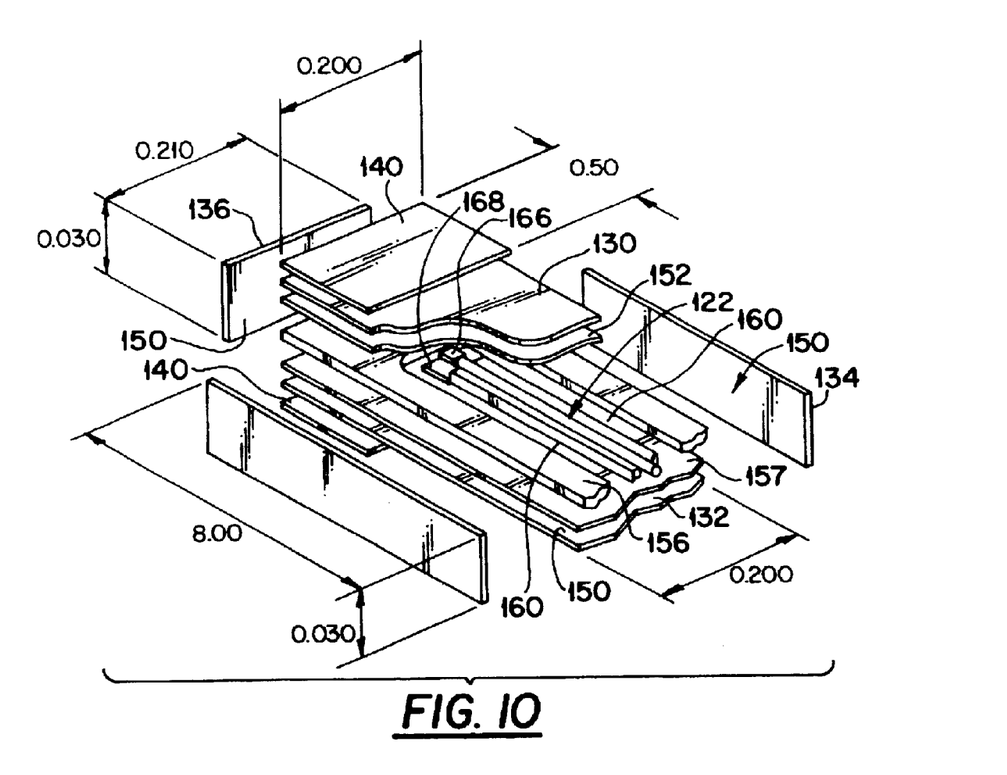
FIG. 10 is an exploded perspective detail view showing a portion of the components of FIG. 9 in greater detail.

Referring now to FIGS. 9 and 10, which are exploded views of the embodiment shown in FIG. 8, the interior surfaces of plates 132, 134 and 136 are provided with metalized coatings, or layers, 150 that form, when the housing is assembled, a Faraday box which encloses and electrically isolates components inside the housing from surrounding electric fields.

Three plates, or sheets, are interposed between housing plates 130 and 132. These three plates include two plates 152 and 154 of a dielectric or insulating material, such as a ceramic material which is commonly employed for printed circuit boards. The third plate 156 can be made of the same material as plates 152 and 154, or any other suitable insulating material.

Plate 156 is provided with cutouts that form a coolant flow channel 160 and a slot 162 which receives optical fiber 122. In FIG. 9, coolant flow channel 160 and slot 162 are cut only partially through the thickness of plate 156, while in FIG. 10 these extend entirely through plate 156. Either alternative can be used.

Coolant channel 160 has two longitudinal branches which are joined together by a connecting branch at a location adjacent front plate 136. In this branch, there is disposed a diode laser 166 that is mounted on a first electrode 168. A second electrode (not visible), identical to electrode 168, is coupled to the upper surface of diode 166. Optical fiber 122 has an input end coupled to an output surface of diode laser 166. The input end of optical fiber 122 may be connected to the output surface of diode laser 166 in a suitable manner.

Preferably, element 166 is a semiconductor laser. However, for measuring high voltage gradients, an LED could be used.

Plate 152 is provided with two through openings 170 that are aligned with openings 144 in plate 130 and with similar openings at the ends the longitudinal branches of channel 160. Openings 144 and 170 provide passages between channel 160 and external coolant flow lines (not shown).

The surfaces of plates 152 and 154 that face plate 156 are each provided with printed circuit components, such as a resistor 174 and an inductor 176. Each resistor 174 is connected in series with a respective inductor 176 and each resulting series arrangement is connected between one of the conductors 129 (FIG. 7) and a respective side of diode laser 166. Specifically, inductor 176 on plate 154 is electrically connected to electrode 168. Inductor 176 on plate 152 is connected to a similar electrode attached to the upper surface of diode laser 166.

Each antenna 140 is conductively connected to a respective side of diode laser 166, for example by being directly connected to an electrode at the associated side of diode laser 166 via an insulated wire 178 which passes through holes, or vias, formed in plates 130, 132, 152, and 154. Thus, an RF voltage differential appearing between antennas 140 is imposed across the junction of diode laser 166. Since each antenna 140 constitutes an equipotential body, the voltage differential between the external surfaces of antennas 140 will be transferred to the internal surfaces of antennas 140 and applied across diode laser 166. Thus, the thickness of antennas 140, as well as the total thickness of plates 130, 132, 152, 154 and 156, that will determine the magnitude of the voltage differential appearing across the junction of diode laser 166 in an RF field having a given intensity. The horizontal dimensions of the antenna determines the capacitance of the antenna and as such determines the sensitivity.

The horizontal dimensions of antennas 140 and the overall dimensions of the probe will influence the spatial resolution of the RF field detection performed by the device.

Diode laser 166 may be constituted, for example, by a commercially available optical fiber pig-tailed diode laser capable of modulating light in response to RF field intensity variations in the frequency range of interest for the practice of the present invention, i.e., up to 1 GHz. Circuit components 174 and 176 are connected to supply a DC bias current from source 128 to diode laser 166. These circuit components also prevent RF currents from flowing to supply 128. In addition, these components block DC current from antennas 140. The antenna has DC voltage on it and the upper plate of the antenna isolates the DC potential from the plasma.

In the above-described embodiment, diode 166 and components 174 and 176 are isolated from an ambient electric field by the Faraday box formed by metallized layers 150. The only component of the probe which extends outside of the housing is optical fiber 122 and leads for the DC laser diode bias. In addition, coolant flow lines coupled to openings 144 and portions of conductors 129 would also be exposed to the plasma. However, these components can easily be made of materials capable of withstanding the conditions existing within the plasma.

The housing will be constructed by bonding plates, or sheets, 130, 132, 134 and 136 together, for example, by fusing them together by frit bonding to form a hermetically sealed chamber. One of these sheets may be attached last by means of an adhesive after plates 152, 154 and 156 have been installed in the housing. This eliminate the need for applying heat to attach the last sheet after the electric field sensing components have been installed in the housing. The housing shown in FIGS. 3–5 can be constructed in the same manner.

The probe device according to this embodiment of the invention is placed into operation by introducing housing 120 into a plasma chamber and supplying a DC bias from source 128 to diode laser 166. The level of the bias voltage is selected to cause diode laser 166 to always operate above threshold, i.e., to always emit light, in the presence of an electric field whose field intensity spectral components are to be measured.

A cooling fluid, such as Fluorinert is caused to flow through cooling channel 160 in order to maintain diode laser 166 at a stable temperature within operating temperature limits thereof.

In the absence of an electric field gradient within the plasma or in the absence of a plasma inside the plasma chamber, the potential difference between antennas 40 will be zero. An electric field can be present in the absence of a plasma, as when the plasma has not yet been struck, or the pressure is too high or low for a plasma to be struck. At this time, the RF spectrum of light being emitted from biassed diode laser 166 will have an initial set of values that will be measured and indicated by spectral analyzer 126. In the absence of a plasma only the fundamental is present. There can be no RF spectra in the light output in the absence of an RF electric field.

Then, a plasma is established in the chamber by introduction of a suitable ionizable gas and establishment of an appropriate RF electric field, resulting in the creation of an RF voltage gradient, or differential, between the outer surfaces of antennas 140. The resulting RF voltage differential between the outer surfaces of antennas 140 then appears across the junction of diode laser 166, causing the light produced by diode laser 166 to be modulated by the fundamental and all significant harmonic frequency components of the RF field voltage. Thus, the light emitted by diode laser 166 and supplied via optical fiber 122 to converter 124 will contain components that vary in magnitude as a function of the fundamental and significant harmonic frequencies of the electric field within the plasma at the location of antennas 140. The resulting spectrum determined by spectral analyzer 26 will be displayed, stored and/or recorded and compared with the initial spectrum obtained in the absence of a RF electric field or a plasma. The resulting comparison will provide an output representative of the RF voltage gradient within the plasma.

As in the case of the embodiments illustrated in FIGS. 1–5, the probe device according to the embodiment of FIGS. 7–10 will measure only electric field intensity variations, or voltage differentials, in a vector direction perpendicular to the outer surfaces of antennas 140. As in the case of the first-described embodiments, electric field intensity variations in other directions, and in particular in three mutual orthogonal directions, can be obtained by forming three of the sensing units shown in FIGS. 7–10 into a combined unit much in the same manner as illustrated in FIG. 6.

Figure 11:
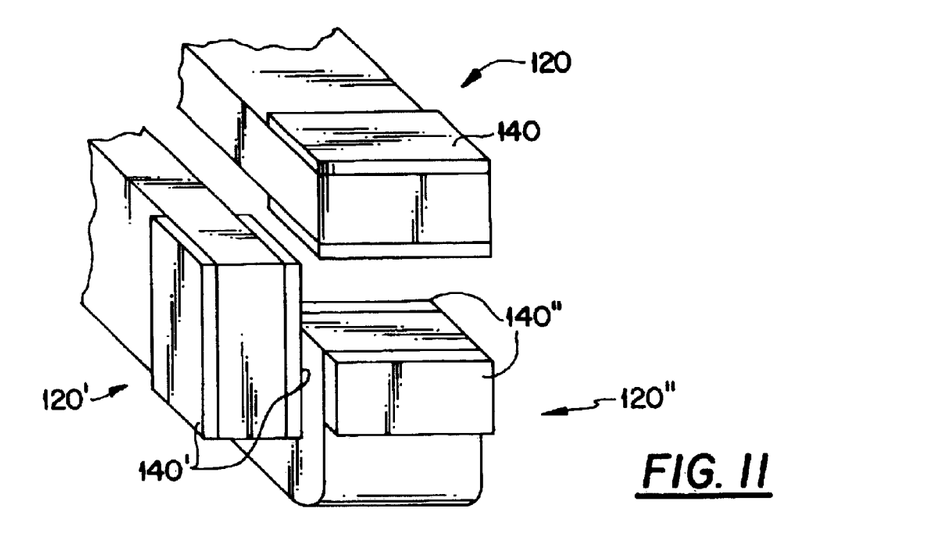
FIG. 11 is a perspective view of a portion of a fifth embodiment of a probe device according to the present invention.

Thus, as shown in FIG. 11, this combined device includes one unit 120 identical to that illustrated in FIGS. 8–10, a second essentially identical unit 120' which is oriented so that its associated antennas 140' are spaced apart in a horizontal direction, and a third unit 120" whose front end is oriented so that its antennas 140" are spaced apart in a horizontal direction perpendicular to the horizontal direction in which antennas 140' are spaced apart. Only unit 120" differs physically from the other two units in that its housing is curved so that the rear ends of all units 120, 120' and 120" can extend in the same direction and be mounted on the same support arrangement.

Figure 12:
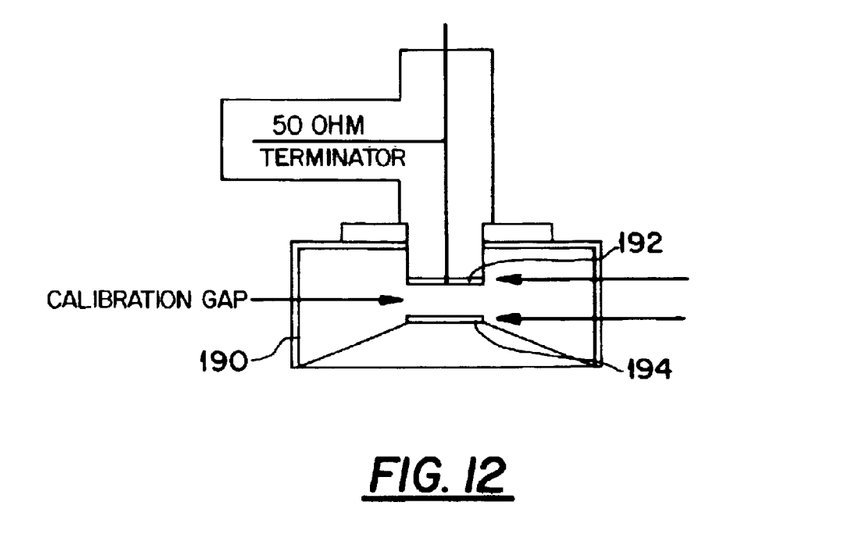
FIG. 12 is a simplified cross sectional view of a device for calibrating a probe device according to the invention.

Any one of the probe devices according to the invention may be a calibrated, for example by means of a calibration unit having the form shown in FIG. 12. This unit is constituted by a calibration chamber 190 containing two electrodes 192 and 194 spaced apart to form a calibration gap which is preferably only slightly larger than the dimension of the electric field sensing unit of the probe device in the direction of an electric field gradient to be measured. Electrode 194 is electrically connected to the outer wall of chamber 190, which forms a system ground.

A RF calibration voltage is applied to electrode 192 and the electric field sensing unit of the probe device to be calibrated is placed between electrodes 192 and 194. A separate high frequency a probe is attached between electrodes 192 and 194 to provide a reference field value, and the value indicated by this probe is compared with the output of the probe device being calibrated. Readings produced by the probe device at different electric field intensities and frequencies can be utilized to produce calibration curves that are unique to each individual probe device. Such a calibration arrangement can also be employed to provide temperature correction values for the device output readings.

A probe such as a Tektronix high voltage probe can measure voltage components at frequencies up to 250 MHZ and can be attached to the upper electrode physically placed partially inside and partially outside chamber 190.

A device according to any one of the embodiments of the invention described herein can be employed to map the RF electric field intensity, or voltage gradient, in a plasma region by positioning the device at successive ones of a plurality of points within the region and obtaining a measurement of the spectral distribution of the RF electric field intensity in one or a plurality of directions at each point. The resulting spectral distribution data produced and stored in spectral analyzer 28 or 126 for all of the measured points within the plasma region can be displayed or otherwise outputted to provide a complete field intensity map.

To cite one example, the probe device can be positioned at a succession of points in a plane directly adjacent the plasma electrode or the wafer chuck in a plasma chamber in order to provide a map of the electric field intensity in a single plane. This map can be used as a valuable tool in the design of the plasma electrode or the wafer chuck. To cite another example, the probe device can be positioned successively at a plurality of points in a number of parallel planes within the plasma region to produce a three-dimensional field intensity map. A map of this type can also be used as a tool in the design of the plasma electrode or the wafer chuck, as well as of other components of the plasma source, including the plasma chamber itself, or as an aid in adjusting RF power supply to the plasma electrode. If the plasma electrode is a segmented electrode consisting of a plurality of individual subelectrodes, either of the maps described above can provide information for adjusting the relative amplitude, phase, frequency or wave form of the RF supply to each individual subelectrode.

Figure 13:
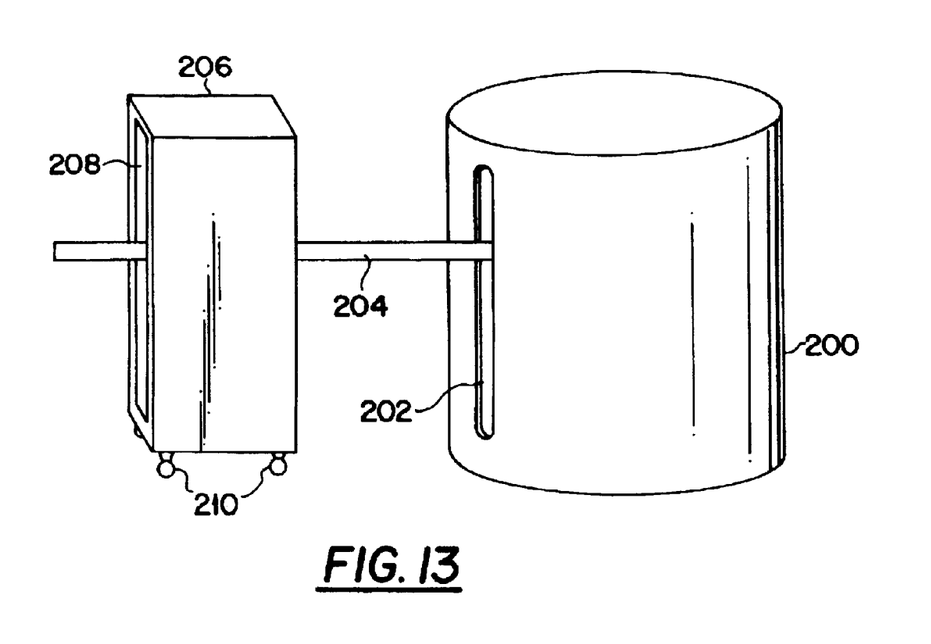
FIG. 13 is a perspective view of an embodiment of an RF field mapping apparatus which can employ a probe device according to the invention.

One arrangement, which can be used to produce such maps is illustrated in simplified form in FIG. 13. A reactor chamber 200 in which a plasma is to be established is provided has an outer wall provided with an elongated vertical slot 202. The electric field sensing unit of any one of the devices disclosed herein is mounted at the end of a supporting rod 204 that is carried by a carrier unit 206. Carrier unit 206 is provided with a vertically elongated passage 208 through which rod 204 extends. Within carrier unit 206, there are provided appropriate mechanisms (not shown) which hold rod 204 in a horizontal orientation and can displace rod 204 vertically in translation. Unit 206 is mounted on wheels or rollers 210 that allow unit 206 to be moved in a manner to pivot rod 204 about a horizontal axis defined essentially by slot 202. The mechanism which holds rod 204 in unit 206 is also operative to displace rod 204 horizontally along its longitudinally axis. Thus, by displacing unit 206 over a path about the vertical axis of chamber 200 and displacing rod 204 vertically and/or along its longitudinal axis, the sensing unit mounted at the end of rod 204 within chamber 200 can be brought to any position within the plasma region.

While the description above refers to particular embodiments of the present invention, it will be understood that many modifications may be made without departing from the spiritz thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. An RF electric field probe device for measuring an RF electric field intensity in a plasma, said device comprising:
   an electric field sensing unit which comprises:
      a first electro-optical component positionable in the plasma and operable to modulate light as a function of variations of the RF electric field in the plasma at the fundamental frequency and harmonics of the RF electric field, and
      a first antenna unit electrically coupled to said first component for coupling said first component to the RF electric field; and
   an output unit coupled to said electric field sensing unit for providing an output signal containing information relating to the magnitude and frequency of the modulation which occurs in said first component.

2. The device according to claim 1, wherein said first antenna unit comprises a pair of electrically conductive plates between which said first component is sandwiched.

3. The device according to claim 2, wherein said first component is a body of a crystal material which is operative to modulate a light beam that is linearly polarized in a polarization direction and that passes through said body in a beam travel direction transverse to the polarization direction by rotation of the polarization direction in response to an electric field extending between said electrically conductive plates in an electric field direction transverse to the beam travel direction.

4. The device according to claim 3, further comprising:
   a source of a polarized beam of coherent light;
   a first optical fiber coupled between said source and said electric field sensing unit for conducting the beam of linearly polarized coherent light from said source to an input surface of said first component; and
   a second optical fiber coupled between said electric field sensing unit and said output unit for conducting to said detector light which has passed through said first component in the beam travel direction.

5. The device according to claim 3, wherein said crystal material is KDP, ADP, KD*P, or CD*A.

6. The device according to claim 4, wherein:
   said electric field sensing unit further comprises a second electro-optical component identical to said first component, and a second antenna unit identical to said first antenna unit and electrically coupled to said second component;
   said first component has an output surface spaced from said input surface in the beam travel direction and at which the light beam arrives after passing through said first component;
   said second electro-optical component has an input surface and output surface spaced from said input surface of said second component in the beam travel direction of said second component;

said electric field sensing unit further comprises an optical coupling unit disposed for conducting the light beam from said output surface of said first component to said input surface of said second component; and said second optical fiber is coupled to said electric field sensing unit by being coupled to said output surface of said second component.

7. The device according to claim 6, wherein said crystal material of said body of each of said components is KDP, ADP, KD*P, or CD*A.

8. The device according to claim 6, further comprising a housing containing said electric field sensing unit and enclosing a sealed space which defines a cooling fluid flow path that extends past said components.

9. The device according to claim 1, wherein said first electro-optical component is a light emitting diode which is biased to emit light having an intensity which varies in response to a voltage differential imposed on said antenna unit by the RF electric field.

10. The device according to claim 9, further comprising: a housing containing said diode and enclosing a sealed space which defines a cooling fluid flow path that extends past said diode.

11. The device according to claim 10, wherein said diode is a laser, said device further includes means for applying a DC bias across said laser, and said housing constitutes a Faraday box that encloses said laser.

12. The device according to claim 11, wherein said antenna unit comprises a pair of electrically conductive plates mounted outside of said housing and two conductors each extending through said housing and conductively connecting a respective one of said plates to said laser.

13. The device according to claim 1, further comprising cooling means associated with said electric field sensing unit for providing a flow of a cooling fluid past said component.

14. An RF electric field measuring system for measuring an RF electric field intensity in at least two different directions in a plasma, said system comprising:

at least two probe devices, each as defined in claim 1, wherein each of said probe devices is oriented to respond to RF field intensity variations in a respective one of the different directions.

15. An RF electric field measuring system for measuring an RF electric field intensity in at three different directions in a plasma, said system comprising:

three probe devices, each as defined in claim 1, wherein each of said probe devices is oriented to respond to RF field intensity variations in a respective one of the different directions.

16. A method for mapping fundamental frequency and harmonic components of an RF electric field in a plasma, comprising the steps of:

positioning an RF electric field sensing unit having a frequency response which encompasses fundamental and significant harmonic frequencies of the RF electric field successively at each of a plurality of points within the plasma, causing the sensing unit to produce, at each of the plurality of points within the plasma, an output signal containing components representing the magnitude of the RF electric field voltage gradient at the fundamental and significant harmonic frequencies; and producing a representation of the magnitude of the voltage gradient at the fundamental and significant harmonic frequencies for all of the plurality of points within the plasma.

17. The method according to claim 16, wherein the plurality of points lie in a single plane.

18. The method according to claim 17, wherein the electric field is radiated into the plasma from a plasma electrode and the plane is parallel to, and adjacent, the electrode.

19. The method according to claim 16, wherein the plasma occupies a three-dimensional volume and the plurality of points are distributed throughout the volume.

20. The method according to claim 16, wherein said electric field sensing unit comprises:

a first electro-optical component positionable in the plasma and operable to modulate light as a function of variations of the RF electric field in the plasma at the fundamental frequency and harmonics of the RF electric field, and a first antenna unit electrically coupled to said first component for coupling said first component to the RF electric field.

21. Apparatus for mapping fundamental frequency and harmonic components of an RF electric field in a plasma, the plasma being coupled within a chamber having a lateral opening, said apparatus comprising:

an RF electric field probe device according to claim 1;

an elongated supporting member carrying said electric field sensing unit of said probe device and insertable through the lateral opening to position said sensing unit within the plasma; and a carrier unit disposed outside of the chamber and carrying said supporting member, said carrier unit being operable for displacing said supporting member to position said sensing unit at any selected location in the chamber.

* * * * *